United States Patent [19]

Guiler

[11] Patent Number: 4,674,304

[45] Date of Patent: Jun. 23, 1987

[54] FRONT ENTRY ELECTRIC METER LOCKING ASSEMBLY

[75] Inventor: Richard S. Guiler, Stewartsville, N.J.

[73] Assignee: E. J. Brooks Company, Newark, N.J.

[21] Appl. No.: 149,662

[22] Filed: May 14, 1980

[51] Int. Cl.[4] .................... B65D 55/14; F16L 21/06; G01R 11/04

[52] U.S. Cl. .................................... 70/164; 70/232; 70/DIG. 57; 292/256.67; 324/110

[58] Field of Search ................ 324/110; 361/364, 369, 361/370, 371; 70/34, 164, 166, 232, DIG. 57; 292/256.67

[56] References Cited

U.S. PATENT DOCUMENTS 2,113,744 4/1938 Pixley et al. .................... 361/364
2,329,349 9/1943 Johansson .................... 361/364
2,870,238 1/1959 Davis .................... 361/369
4,107,959 8/1978 Skarzynski et al. .................... 70/164
4,158,953 6/1979 Nielsen, Jr. .................... 70/164
4,329,860 5/1982 Moberg .................... 70/164

*Primary Examiner*—Ernest F. Karlsen
*Attorney, Agent, or Firm*—Carella, Byrne, Bain & Gilfillan

[57] ABSTRACT

A locking cover assembly for the ends of an electric meter retaining ring, to receive a lock bolt from the front side thereof to retain the cover in place and thereby prevent access to the clamping bolt that retains the ring in place. The cover comprises a housing having an internal locking plate apertured to receive the end of a lock bolt in a position such that it extends between the legs of the retaining ring and over the clamping bolt.

3 Claims, 4 Drawing Figures

FRONT ENTRY ELECTRIC METER LOCKING ASSEMBLY

BACKGROUND OF THE INVENTION

In a commonly used type of electric meter, the meter housing is retained on the meter socket box by a clamping ring of U-shaped cross-section, which encloses the mounting ring of the meter and the mounting flange on the meter socket box. The ends of the clamping ring are turned radially, so that when mounted, they extend downwardly. A bolt is provided to draw the ends of the ring together to tighten the ring around the meter and box flanges.

Means must be provided for preventing unauthorized persons from loosening the ring to remove the meter to short across the terminals to by-pass the meter to obtain un-metered power.

For example, in U.S. Pat. No. 4,008,585 there is illustrated a form of locking cover which has a side aperture aligned with apertures in the ends of the clamping ring, to receive a locking bolt of the so-called barrel lock type, as shown in U.S. Pat. No. 4,015,456. Although the housing illustrated in said U.S. Pat. No. 4,008,585 has achieved considerable commercial success, there are certain meter installations where it cannot be used because the lock bolt must be loaded into the housing from the side. In many meter installations in apartment houses, for example, where there is one meter for each apartment, the meters are often mounted so close together that there is not room enough for the barrel lock and operating key to be positioned between two adjacent meters.

SUMMARY OF THE INVENTION

This invention provides a locking cover and assembly for mounting over the ends of a meter locking ring to prevent access by unauthorized persons to the ring clamping bolt that retains the ends of the ring together. The cover comprises a housing having an opening at the top to receive the ends of the locking ring, and an internal locking plate having an aperture aligned with an aperture in the front of the housing, to receive a lock bolt. The components are so dimensioned that when the cover is assembled onto the legs of the clamping ring and the lock bolt assembled into the housing, the inner end of the lock bolt extends between the clamping ring legs above the clamping bolt, and the locking members of the lock bolt are positioned behind the locking plate, thereby preventing removal of the housing. Access to the lock, which is disposed perpendicular to the plane of the ring, is from the front of the meter, thereby allowing use of the device in installations in which meters are mounted closely together.

DESCRIPTION OF THE ILLUSTRATED EMBODIMENT

Figure 1:
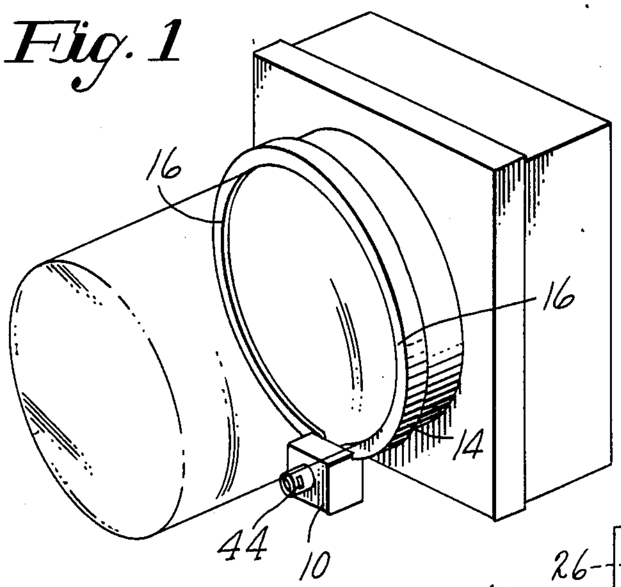
FIG. 1 is perspective view of a meter assembly utilizing the locking housing of the invention.
Figure 3:
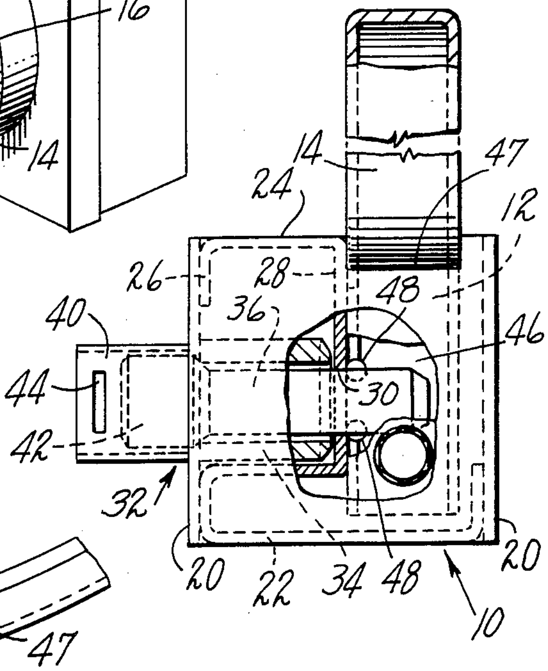
FIG. 3 is a view in side elevation of the structure of FIG. 2.
Figure 2:
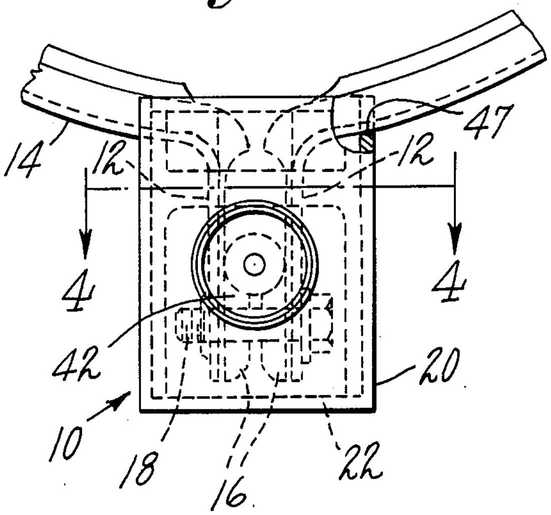
FIG. 2 is a view in front elevation of a portion of the assembly of FIG. 1, with interior components shown in dashed line.
Figure 4:
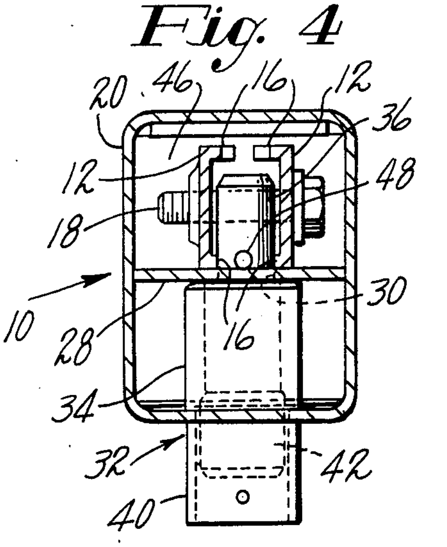
FIG. 4 is a view in section taken on line 4—4 of FIG. 2.

Referring to the drawing, there is illustrated a protective housing 10 for assembly onto the outwardly turned ends 12 of a clamping ring 14. The ring may be U-shaped in cross-section, having inturned edges 16 for holding an electric meter onto a meter box, as is well known in the art. The ends 12 of the ring are provided with suitable apertures (one of which may be threaded) to receive a clamping screw 18 for tightening the ring. In the usual installation, since the size of electric meters has been standardized throughout the industry, when the ring has been adequately tightened around a meter mounting flange and a meter socket box flange, the ends 12 of the ring are substantially parallel and slightly spaced apart. (See FIG. 2)

The housing assembly 10 comprises an outer cover 20 which is generally rectangular in cross section, with an open top. Disposed within the outer cover is a bracket which has a bottom portion 22 which forms the bottom of the housing, an upper portion 24 closing the front portion of the top opening of the cover, an end portion 26 fastened to the front of the cover, and a connecting portion extending between the upper and lower portions forming a locking plate 28 which is spaced rearwardly from the front of the housing, and has an aperture 30.

The front face of the cover 20 is also provided with an aperture receiving a hollow housing 32 having an inner portion 34 dimensioned to receive the body 36 of a locking bolt to be assembled therein, and an outer portion 40 dimensioned to receive the head portion 42 of the locking bolt so that it recessed therein inwardly of slots 44 in the wall of said outer portion. The axis of the bushing is aligned with the center of the opening 30.

The upper portion 24 of the internal bracket closes a portion of the top of the cover, leaving a rectangular aperture 46 having a width (front to back) only slightly greater than the width of the ends 12 of the clamping ring. The side edges of the housing at the aperture 46 have recessed portions 47.

After the clamping ring has been assembled and the screw 18 tightened, the housing 10 may be assembled onto the ends 12 by inserting the ends into the aperture 46 until the portion of the clamping ring adjacent the ends 12 seat in the recessed portions 47.

The position of the aperture 30 in the locking plate and the bushing 32 is such that when the housing 10 is assembled onto the ends 12 as above described, the extended cylindrical volume formed by the bushing 32 and the aperture 30 is disposed above the clamping screw 18.

The locking bolt 38 is of the well-known type having retractable locking elements 48 operable by internal mechanism (not shown) actuated by insertion of a suitable tool (not shown) into an opening in the front end of the bolt, as described in above identified U.S. Pat. No. 4015456.

The locking bolt 38 may now be assembled into the housing by inserting it into the bushing so that the forward end of the bolt protrudes through the aperture 30 in the locking plate 28. The dimensions of the components are such that the locking elements 48, when the lock is so assembled, are disposed beyond the locking plate 28, and the forward end of the bolt 38 protrudes beyond the locking plate far enough to extend over the clamping screw 18, thereby preventing removal of the housing from the ends of the clamping ring.

Sideways tipping movement of the housing is prevented by the engagement of the upper side edges of the cover 20 with the adjacent portions of the clamping ring, and front and back tipping movement is prevented by the fact that the distance from the rear side of the cover and the locking plate is substantially the same as the width of the ends of the clamping ring disposed therein.

In the usual case the edges 50 of the ends 12 of the clamping ring are turned inwardly, so that in the assembled condition, said edges extend toward each other. To accommodate the end of the lock bolt, a portion of said edges 50 that are positioned opposite the aperture 30 in the locking plate 28 may be removed to allow the end of the locking bolt to extend into the space between the clamping ring ends as previously described.

The herein described assembly positions the locking bolt at a right angle to the plane of the clamping ring, so that the operating tool may be inserted into the bolt from the front of the meter, allowing use of this type of housing and locking bolt in installations where a number of meters are closely spaced together.

Since certain modifications obvious to one skilled in the art may be made in the herein illustrated embodiment of the invention, it is intended that all matter contained herein be interpreted in an illustrative and not a limiting sense.

I claim:

1. A housing for use with an electric meter clamping ring of the type having a generally circular portion and downwardly extending parallel ends having means thereon receiving a clamping screw or the like for drawing the ends together, said housing being shaped and dimensioned to receive a lock bolt of the type comprising an elongated solid shank with locking elements near one end which are radially movable between a locking and an unlocking position by means of a tool inserted into an aperture in the front end thereof, said housing comprising a hollow body having an opening in the upper surface to receive said downwardly extending parallel ends and said clamping screw, a lock aperture in the front of the housing, and means in the housing associated with the lock aperture to receive said bolt, said means being so positioned and dimensioned that the forward end of the assembled lock bolt extends over the clamping screw to prevent removal of the housing, and means in the housing positioned for engagement with the locking elements of the bolt.

2. A locking housing as set out in claim 1 in which the opening in the top of the housing has a dimension in a direction perpendicular to the plane of the clamping ring which is only slightly greater than the width of the end portions of the clamping ring, the top side edges of the housing at said aperture having recessed portions positioned to receive the portion of the clamping ring adjacent the end portions.

3. A housing as set out in claim 1 in which a lock receiving bushing is provided in the lock aperture and a locking plate having a lock receiving opening is provided in the housing, the inner end of said bushing extending to the locking plate.

* * * * *